United States Patent
Sakai et al.

(10) Patent No.: US 7,564,062 B2
(45) Date of Patent: Jul. 21, 2009

(54) ELECTRODE FOR P-TYPE SIC

(75) Inventors: Tomohiro Sakai, Kyoto (JP); Miki Moriyama, Kyoto (JP); Masanori Murakami, Kyotanabe (JP); Naoki Shibata, Aichi (JP)

(73) Assignee: Toyoda Gosei, Co., Ltd., Nishikasugai-gun, Aichi (JP)

( * ) Notice: Subject to any disclaimer, the term of this patent is extended or adjusted under 35 U.S.C. 154(b) by 479 days.

(21) Appl. No.: 10/695,439

(22) Filed: Oct. 29, 2003

(65) Prior Publication Data
US 2006/0169985 A1 Aug. 3, 2006

(30) Foreign Application Priority Data
Oct. 29, 2002 (JP) .................... P2002-314301

(51) Int. Cl.
*H01L 31/0312* (2006.01)
(52) U.S. Cl. ........................ 257/77; 257/781
(58) Field of Classification Search ............... 257/77, 257/781
See application file for complete search history.

(56) References Cited

U.S. PATENT DOCUMENTS 5,877,077 A * 3/1999 Kronlund ............ 438/602
6,242,761 B1 * 6/2001 Fujimoto et al. ......... 257/94
6,511,908 B2 * 1/2003 Kinoshita et al. ......... 438/637
6,943,376 B2 * 9/2005 Nakatsuka et al. ......... 257/77

FOREIGN PATENT DOCUMENTS

| JP | 04-085972 | * | 3/1992 |
| JP | 04-196420 | | 7/1992 |
| JP | 04-225568 | | 8/1992 |
| JP | 5-13812 | | 1/1993 |
| JP | 2002-252233 | | 9/2002 |

OTHER PUBLICATIONS

PTO 07-2046 Schreiber Translations, Inc. translation of JP 04-085972.*
Tsukimoto, S., et al., "Electrical properties and microstructure of ternary Ge/Ti/Al ohmic contacts to p-type 4H-SiC", Nov. 2004, J. App. Phys., vol. 96, No. 9, p. 4976-81.*
Konishi, R., et al., "Development of Ni/Al and Ni/Ti/Al ohmic contact materials for p-type 4H-SiC", 2003, Mat. Sci. Eng., B98, p. 286-93.*

* cited by examiner

*Primary Examiner*—Howard Weiss
(74) *Attorney, Agent, or Firm*—McGinn IP Law Group, PLLC

(57) ABSTRACT

A p-type electrode containing a first electrode material exhibiting an eutectic reaction at a temperature of 600° C. or lower, and a second electrode material of aluminum (Al).

17 Claims, 1 Drawing Sheet

I-V CHARACTERISTIC AFTER HEAT TREATMENT

ELECTRODE FOR P-TYPE SIC

The present application is based on Japanese Patent Application No. 2002-314301, which is incorporated herein by reference.

BACKGROUND OF THE INVENTION

1. Field of the Invention

The present invention relates to a silicon carbide (SiC) device. Particularly, it relates to an electrode for p-type SiC, used in an SiC device.

2. Description of the Related Art

Application of silicon carbide (SiC) to a radiofrequency power device, a high-temperature device and an optoelectronic device has been expected and research toward practical application of silicon carbide (SiC) has advanced. A combination (TiAl) of titanium (Ti) and aluminum (Al) is generally used as a p-electrode for SiC device, that is, an ohmic electrode for p-type SiC (see Patent Document 1 and so on).

[Patent Document 1]

Unexamined Japanese Patent Publication No. Hei-5-13812

Generally, in most cases, a device needs an ohmic electrode. In a device using compound semiconductor, it is however generally impossible to obtain an ohmic junction between a semiconductor material layer and an electrode without any heat treatment, that is, Schottky characteristic appears when a metal layer is formed simply. On the other hand, in an ohmic junction based on a heat treatment, obtained contact resistance varies largely according to the semiconductor material, the electrode material, the heat-treatment temperature, the heat-treatment time, and so on.

At present, Ti/Al expected as an ohmic contact material having low resistance to p-type SiC needs to contain a large amount of Al for reducing resistance and needs to be heat-treated at a temperature of about 1000° C. though considerable reduction in resistance can be achieved by Ti/Al. A problem of reduction in device function and device life caused by deterioration of surface morphology and thermal damage to semiconductor crystal layers has been pointed out.

SUMMARY OF THE INVENTION

The invention is developed to solve the problem and an object of the invention is to provide an electrode for p-type SiC, which is good in surface homology and little in thermal damage to semiconductor crystal layers caused by the formation of the electrode.

The present inventors have made examination repetitively and eagerly to achieve the foregoing object. As a result, there has been found the invention configured as follows:

An electrode for p-type SiC, containing a first electrode material exhibiting an eutectic reaction at a temperature of 600° C. or higher, and a second electrode material comprising at least aluminum (Al).

According to the electrode for p-type SiC configured as described above, the first electrode material exhibiting an eutectic reaction with Al is added. Accordingly, ohmic characteristic can be obtained by a heat-treating step at a low temperature compared with the related art, so that surface flatness of the electrode is improved. In addition, thermal influence on semiconductor crystal layers can be restrained from being caused by the formation of the electrode. Accordingly, the use of the electrode for p-type SiC according to the invention permits production of an SiC device excellent in device characteristic.

DETAILED DESCRIPTION OF THE PREFERRED EMBODIMENTS

Figure 1:
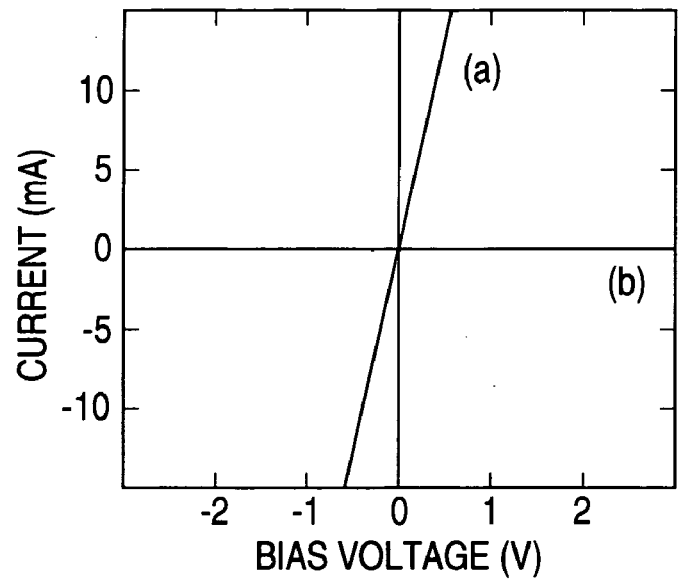
FIG. 1 is a graph showing a result of an experimental example, that is, showing current-voltage (I-V) characteristic of each sample after a heat treatment at 600° C. for 30 minutes, wherein the curve (a) shows Ga/Ti/Al and the curve (b) shows Ti/Al.

The term "electrode for p-type SiC" used in the invention means an electrode formed on a p-type SiC semiconductor layer. The configurational type of p-type SiC semiconductor to which the electrode for p-type SiC according to the invention is applied is not particularly limited. Examples of the configurational type of p-type SiC semiconductor include a 4H type used in Embodiment which will be described later, a 6H type, a 15R type, a 21R type, and a 3C type. The kind of the device to which the electrode for p-type SiC according to the invention is applied is not particularly limited either. For example, the electrode for p-type SiC can be applied to various kinds of devices used in a radiofrequency power device, a high-temperature device, an optoelectronic device, etc.

The first electrode material is not particularly limited if the first electrode material is a material reacting with Si and exhibiting an eutectic reaction with Al at a relatively low temperature. For example, germanium (Ge) or the like can be used as the first electrode material. Because the addition of the first electrode material accelerates the reaction at a low temperature, decrease in the contact-forming temperature can be attained.

The electrode for p-type SiC according to the invention contains a second electrode material of aluminum (Al) in addition to the first electrode material. When aluminum is contained, reduction in contact resistivity can be attained. Accordingly, the electrode for p-type SiC can be formed as an electrode better in ohmic characteristic.

Preferably, the electrode for p-type SiC according to the invention further contains a third electrode material of titanium (Ti). That is, the first electrode material of germanium, the second electrode material of aluminum and the third electrode material of titanium are preferably contained in the electrode for p-type SiC. When the third electrode material of titanium is contained as described above, greater reduction in contact resistivity can be attained.

Further, each of the first, second and third electrode materials is not limited to a single element, and two or more elements can be mixed to the extent that the necessary properties can be retained.

Preferably, the electrode for p-type SiC according to the invention includes a layer of the first electrode material (hereinafter referred to as "first electrode material layer"). More preferably, the first electrode material layer is formed so as to be in contact with a p-type SiC semiconductor layer. For example, the electrode for p-type SiC according to the invention can by formed by the steps of: forming a layer of the first electrode material on a p-type SiC semiconductor layer; subsequently laminating a layer of another electrode material thereon; and heat-treating these layers.

In a form in which the electrode for p-type SiC according to the invention contains a second electrode material in addition to the first electrode material, the electrode for p-type SiC preferably includes the first electrode material layer, and a layer of the second electrode material (hereinafter referred to as "second electrode material layer"). In other words, in the producing process, the first electrode material layer and the second electrode material layer are preferably formed. The laminating sequence of the first electrode material layer and the second electrode material layer is not particularly limited. Preferably, the first electrode material layer and the second electrode material layer are formed and laminated successively on the p-type SiC semiconductor layer side. Preferably, the first electrode material layer is formed so as to be in contact with the p-type SiC semiconductor layer in the same manner as in the aforementioned case. A layer of another material may be interposed between the first electrode material layer and the second electrode material layer. The first electrode material layer and/or the second electrode material layer may be provided as a multi-layered structure. For example, the electrode for p-type SiC according to the invention may be formed so that a first electrode material layer, a second electrode material layer and a first electrode material layer may be laminated successively on the p-type SiC semiconductor layer side.

In a form in which the electrode for p-type SiC according to the invention contains a first electrode material, a second electrode material, and a third electrode material, the electrode for p-type SiC preferably includes the first electrode material layer, the second electrode material layer, and a layer of the third electrode material (hereinafter referred to as "third electrode material layer"). In other words, in the producing process, the first electrode material layer, the second electrode material layer and the third electrode material layer are preferably formed. The laminating sequence of these respective layers is not particularly limited. Preferably, the first electrode material layer, the third electrode material layer and the second electrode material layer are formed and laminated successively on the p-type SiC semiconductor layer side. Preferably, the first electrode material layer is formed to be in contact with the p-type SiC semiconductor layer in the same manner as the aforementioned case. At least one layer of another material may be interposed between the first electrode material layer and the third electrode material and/or between the third electrode material layer and the second electrode material layer. The first electrode material layer, the third electrode material layer and/or the second electrode material layer may be provided as a multi-layered structure.

A method for forming the first electrode material layer, the second electrode material layer and the third electrode material layer is not particularly limited. An MBE method, a vacuum vapor deposition method, a sputtering method, a resistance heating method, etc. may be employed.

The electrode for p-type SiC according to the invention is formed by the steps of: laminating the electrode material layers (and other layers) on the p-type SiC semiconductor layer; and heat-treating these layers. Preferably, the p-type SiC semiconductor is cleaned (e.g., chemically cleaned) before the formation of the electrode material layers. This is for the purpose of laminating the electrode material layers in a good state. The heat treatment is carried out for the purpose of forming an ohmic contact between the p-type SiC semiconductor layer and the electrode for p-type SiC according to the invention.

The heating temperature and the heating time are adjusted so appropriately that a good ohmic contact can be formed.

In the invention, a heating temperature of 600° C. or lower is used as the heating temperature at which thermal damage to a device can be suppressed as sufficiently as possible and at which the heating time can be shortened to meet industrial production efficiency. It is a matter of course that a heating temperature of higher than 600° C. may be used if there is no thermal damage to the device.

When the heating temperature is 600° C., the heating time is selected to be preferably not shorter than 25 minutes, more preferably not shorter than 30 minutes.

Preferably, the heat treatment is carried out in a vacuum. The heat treatment may be carried out in an inert gas atmosphere. A nitrogen gas, a helium gas, an argon gas, etc. may be used as the inert gas.

An experimental example of the invention will be described below.

The electric characteristic and surface flatness of a GeAl ohmic contact material for p-type 4H—SiC were examined in this experimental example.

An electrode having a first layer of Ge, a second layer of Ti, and a third layer of Al was produced as a sample. A p-type 4H—SiC (0001) epiwafter with a dopant concentration of $3.20 \times 10^{18}$ cm$^{-3}$ was used as a substrate. Al of 99.99% purity, Ge of 99.999% purity and Ti of 99.99% purity were used as base materials. The substrate was sacrificially oxidized at 1150° C. for an hour so that an oxide film about 10 nm thick was formed in advance. After ultrasonic cleaning with acetone or methanol and writing of a circular pattern by photolithography, the oxide film was removed with diluted hydrofluoric acid. After the substrate was disposed in a vacuum evaporation system, a 60 nm-thick film of Ge was first formed by resistance heating, an 80 nm-thick film of Ti was then formed by electron beam vapor deposition and a 360 nm-thick film of Al was finally formed by resistance heating. Then, the sample was heat-treated at 600° C. in an ultra-high vacuum chamber with a base vacuum of the order of $10^{-8}$ Torr while I-V characteristic was measured at intervals of 10 minutes.

FIG. 1 shows I-V characteristic of the Ge/Ti/Al contact (a) after a heat treatment at 600° C. for 30 minutes and I-V characteristic of a Ti/Al (50 nm/141 nm) contact (b) after a heat treatment at 600° C. for 30 minutes for the sake of comparison. Incidentally, the curve of (b) is nearly equal to the horizontal axis. A circular pattern having a diameter of 200 μm and a width of 8 μm was used for the measurement. After the heat treatment at 600° C. for 30 minutes, the Ti/Al contact (b) exhibited such Schottky characteristic that there was little current flowing in the Ti/Al contact (b) whereas the Ge/Ti/Al contact (a) exhibited ohmic contact characteristic. On this occasion, the specific contact resistance value measured by TLM measurement using patterns of concentric circles was $3.8 \times 10^{-4}$ (Ωcm$^2$).

An embodiment of the invention will be described below.

Figure 2:
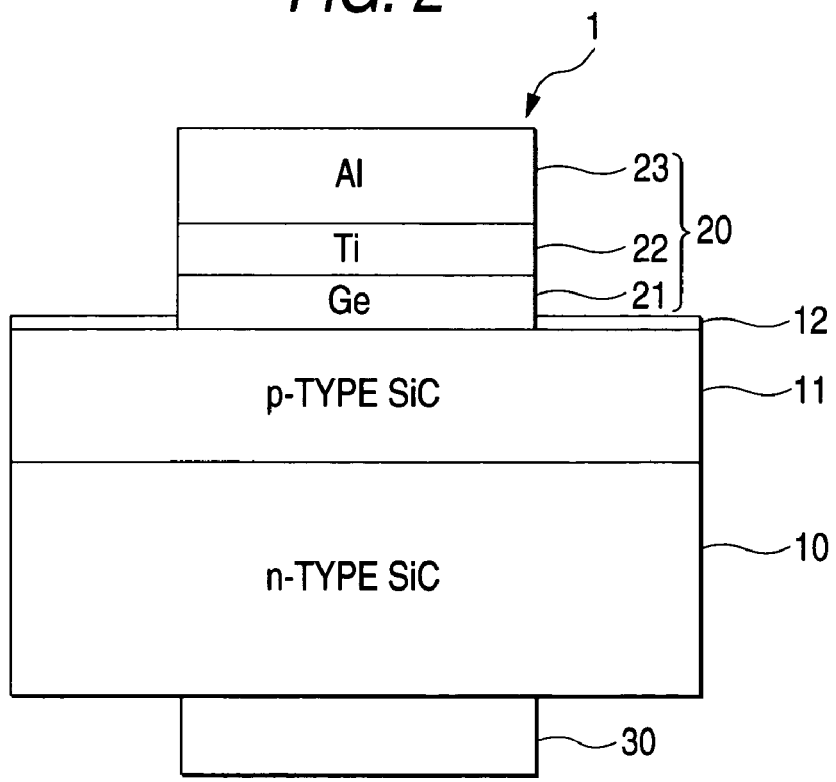
FIG. 2 is a view typically showing the configuration of an SiC device 1 as an embodiment of the invention.

FIG. 2 is a view typically showing the configuration of an SiC device 1 as an embodiment of the invention. The SiC device 1 can be produced as follows.

First, an n-type SiC substrate 10 is disposed in a chamber of a vapor phase epitaxy apparatus. A monosilane (SiH$_4$) gas and propane (C$_3$H$_8$) as raw material gases and a trimethyl aluminum ((CH$_3$)$_3$Al) gas as an impurity gas with a hydrogen gas used as a carrier gas are supplied into the chamber to form a p-type SiC layer 11 about 5 μm thick at a growth temperature of about 1400° C. Incidentally, the p-type SiC layer 11 may be also formed by a known method such as a molecular beam epitaxy method (MBE method), a halide vapor phase epitaxy method (HVPE method), a sputtering method, an ion-plating method, or an electron showering method.

Then, an SiO$_2$ film 12 about 10 nm thick is formed in a surface of the p-type SiC 11 by sacrificial oxidization in an O$_2$ atmosphere at 1150° C. for 60 minutes. After electrode patterning is made by photolithography, part of the SiO$_2$ film is peeled with diluted hydrofluoric acid. Then, a Ge layer 21 about 60 µm thick is formed by an electron beam method. Similarly, a Ti layer 22 and an Al layer 23 are formed by an electron beam method and a resistance heating method respectively. Then, an electrode pattern is formed by a lift-off method. By the aforementioned steps, a p-electrode 20 in which Ge, Ti and Al are laminated successively is produced as shown in FIG. 2.

Then, a heat treatment is carried out in an ultra-high vacuum chamber at 600° C. for 30 minutes to form an ohmic contact between the p-type SiC 11 and the p-electrode 20.

Then, an n-electrode 30 composed of V and Al is formed on a surface of the n-type SiC 10 by a vapor deposition method. After the aforementioned steps, the step of separating the wafer into chips is performed using a scriber or the like. Thus, each SiC device 1 is obtained.

The invention is not limited to the description of the embodiment at all. Various modifications that can be easily conceived by those skilled in the art may be included in the invention without departing from the scope of claim for a patent. It is a matter of course that the invention can be applied to other semiconductor devices using SiC, such as Group III nitride compound semiconductors on SiC.

What is claimed is:

1. An electrode for a p-type SiC, comprising a first electrode material, and a second electrode material of aluminum (Al), said first and second electrode materials exhibiting an eutectic reaction at a temperature of 600° C. or lower, wherein a layer made of said first electrode material is in contact with a surface of the p-type SiC, said first electrode material comprising germanium (Ge).

2. An electrode for a p-type SiC according to claim 1, further comprising a third electrode material of titanium (Ti).

3. An electrode for a p-type SiC, comprising a first layer of germanium (Ge), and a second layer of aluminum (Al), wherein said first and second layers are formed successively on the p-type SiC and said first layer is in contact with a surface of the p-type SiC, the first layer and second layer exhibiting a eutectic reaction at a temperature of 600° C. or lower.

4. An electrode for a p-type SiC according to claim 3, further comprising a third layer of titanium (Ti) formed between said first and second layers.

5. An SiC device including a p-type SiC, and an electrode for the p-type SiC defined in claim 1 and formed on said p-type SiC.

6. An SiC device including a p-type SiC, and an electrode for the p-type SiC defined in claim 2 and formed on said p-type SiC.

7. An SiC device including a p-type SiC, and an electrode for the p-type SiC defined in claim 3 and formed on said p-type SiC.

8. An SiC device including a p-type SiC, and an electrode for the p-type SiC defined in claim 4 and formed on said p-type SiC.

9. An electrode for a p-type SiC according to claim 1, further comprising an ohmic junction formed between the p-type SiC and the first electrode material.

10. An electrode for a p-type SiC, comprising:
   means for accelerating a eutectic reaction at a temperature of 600° C. or lower;
   first means for reducing contact resistivity; and
   second means for reducing contact resistivity, wherein the first means for reducing contact resistivity comprises a different component than the second means for reducing contact resistivity,
   wherein the means for accelerating the eutectic reaction further comprises means for solidifying a mixture of Ge, Al, and Ti at 600° C. or lower.

11. An electrode for a p-type SiC according to claim 10, wherein the means for accelerating a eutectic reaction comprises a layer disposed on a surface of the p-type SiC.

12. An electrode for a p-type SiC according to claim 10, wherein the second means for reducing contact resistivity is disposed between the means for accelerating a eutectic reaction and the first means for reducing contact resistivity.

13. An electrode for a p-type SiC according to claim 10, further comprising an ohmic junction between the means for accelerating a eutectic reaction and a surface of the p-type SiC.

14. An electrode for a p-type SiC according to claim 10, further comprising means for suppressing thermal damage to the electrode during heat treatment.

15. An electrode for a p-type SiC according to claim 13, further comprising means for increasing current flow through the ohmic junction.

16. An electrode for a p-type SiC according to claim 1, wherein a thickness of said germanium is approximately 60 nm and a thickness of said aluminum is approximately 360 nm.

17. An electrode for a p-type SiC according to claim 2, wherein a thickness of said germanium is approximately 60 nm, a thickness of said aluminum is approximately 360 nm, and a thickness of said titanium is approximately 80 nm.

* * * * *